US007612446B2

(12) United States Patent
Dang et al.

(10) Patent No.: US 7,612,446 B2
(45) Date of Patent: Nov. 3, 2009

(54) STRUCTURES TO ENHANCE COOLING OF COMPUTER MEMORY MODULES

(75) Inventors: Hien P. Dang, Nanuet, NY (US); Vinod Kamath, Raleigh, NC (US); Vijayeshwar D. Khanna, Millwood, NY (US); Gerard McVicker, Stormville, NY (US); Sri M. Sri-Jayantha, Ossining, NY (US); Jung H. Yoon, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 502 days.

(21) Appl. No.: 11/604,152

(22) Filed: Nov. 22, 2006

(65) Prior Publication Data

US 2008/0116571 A1 May 22, 2008

(51) Int. Cl.
*H01L 23/34* (2006.01)
*H05K 7/20* (2006.01)
*H01L 21/00* (2006.01)
*F28F 7/00* (2006.01)

(52) U.S. Cl. ............... 257/707; 257/717; 257/719; 257/720; 257/726; 361/704; 361/710; 361/711; 361/717; 438/123; 165/80.3; 174/16.3

(58) Field of Classification Search .............. None
See application file for complete search history.

(56) References Cited

U.S. PATENT DOCUMENTS

| 6,465,728 | B1 * | 10/2002 | McLaughlin et al. | 174/16.3 |
| 6,765,797 | B2 * | 7/2004 | Summers et al. | 361/704 |
| 7,151,668 | B1 * | 12/2006 | Stathakis | 361/700 |
| 7,391,613 | B2 * | 6/2008 | Lai et al. | 361/700 |
| 2006/0221573 | A1 * | 10/2006 | Li | 361/704 |
| 2007/0070607 | A1 * | 3/2007 | Goodwin | 361/719 |

\* cited by examiner

*Primary Examiner*—Alonzo Chambliss
(74) *Attorney, Agent, or Firm*—Michael J. Buchenhorner

(57) ABSTRACT

A spring-like cooling structure for an in-line chip module is formed from a continuous sheet of a thermally conducting material having a front side and a back side, the sheet folded at substantially a one-hundred and eighty degree angle, wherein a length of the structure substantially correlates to a length of the in-line chip module, and a width of the structure is wider than a width of the in-line chip module such that the structure fits over and substantially around the in-line chip module; openings at a left-side, right-side and a bottom of the structure for easily affixing and removing the structure from the in-line chip module; a top part comprising a top surface disposed over a top of the in-line chip module when affixed to the in-line chip module, and comprising an angled surface flaring outward from the in-line chip module, the angled surface positioned directly beneath the top surface; a center horizontal part; a gap between the center horizontal part and the plurality of chips; and a flared bottom area of the structure.

18 Claims, 15 Drawing Sheets

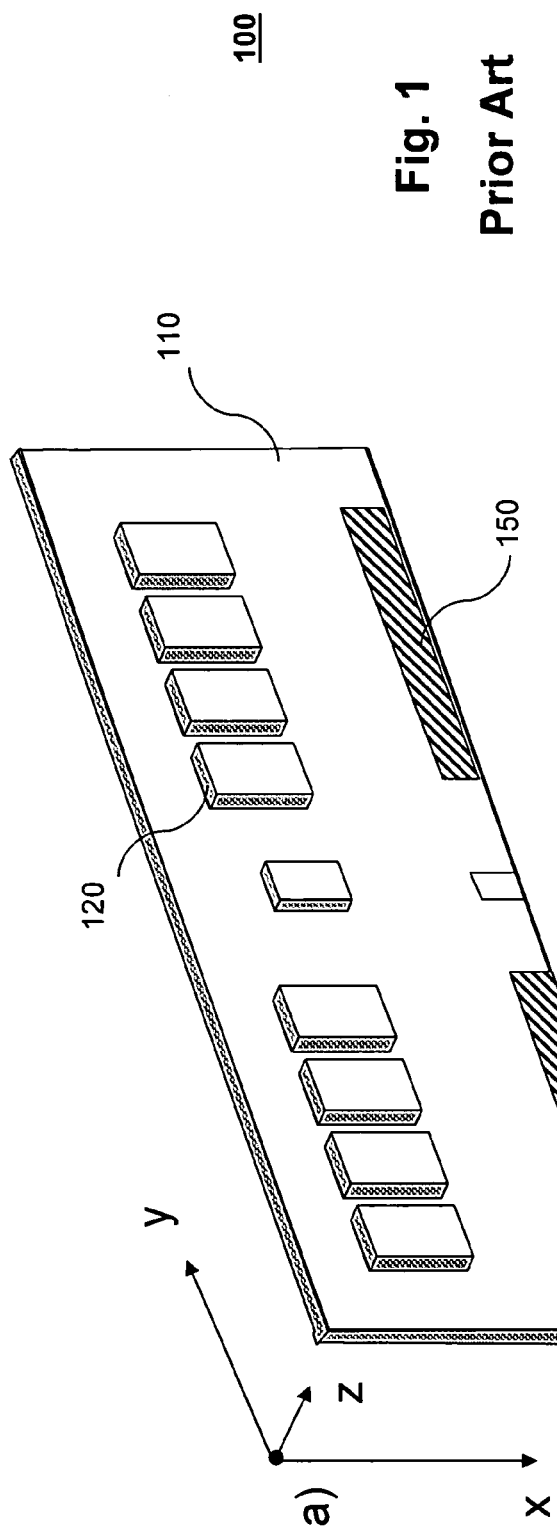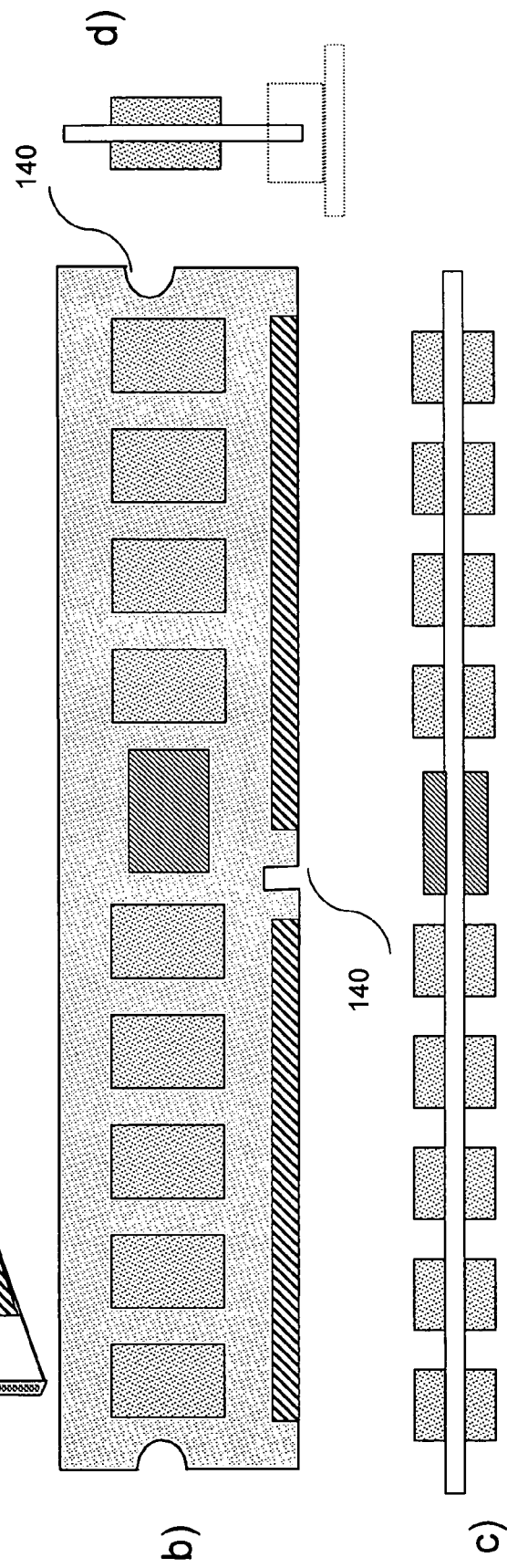
Fig. 1
Prior Art

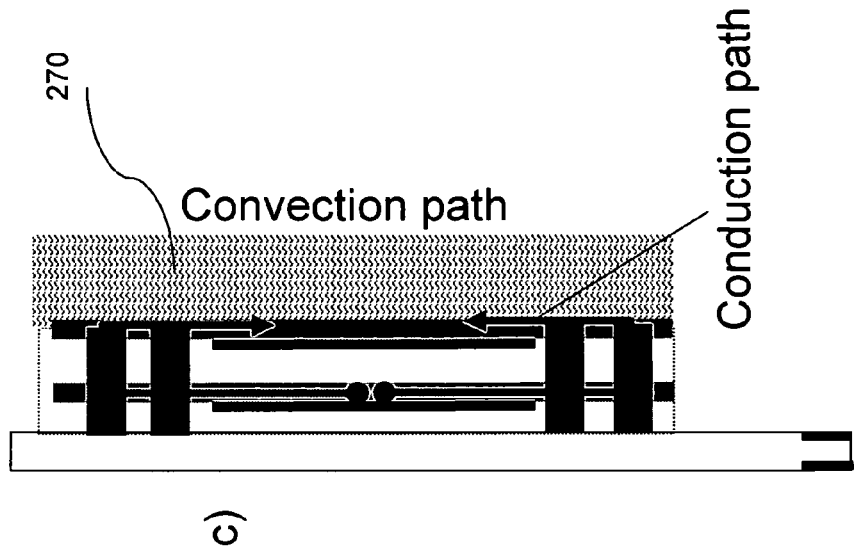
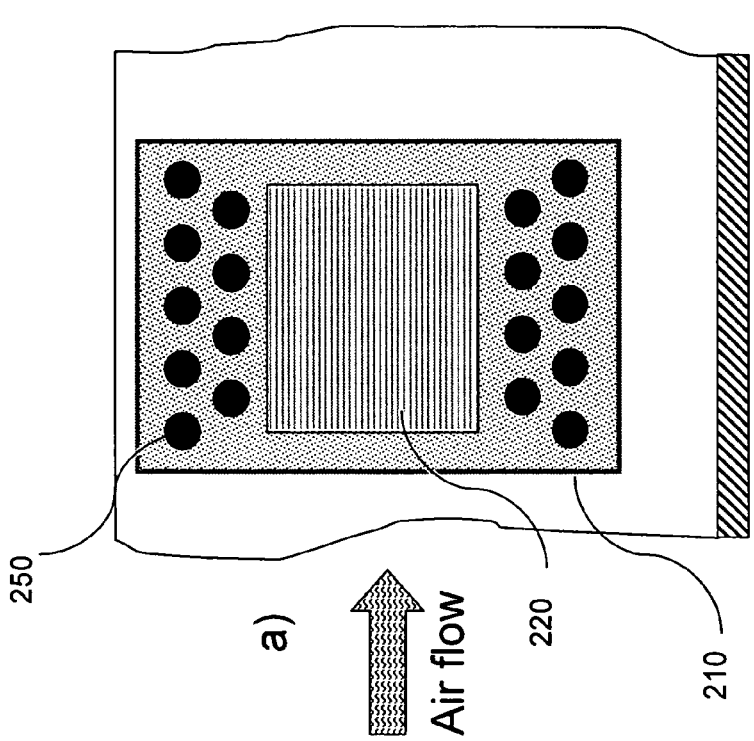
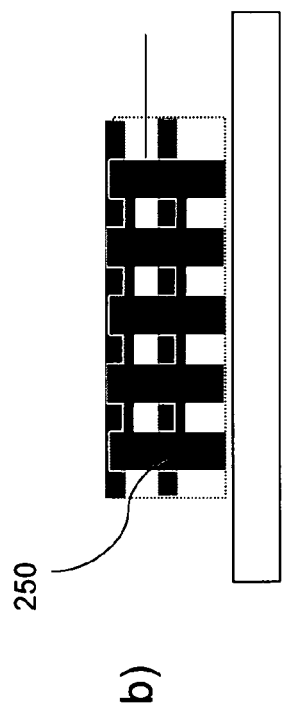
Fig. 2

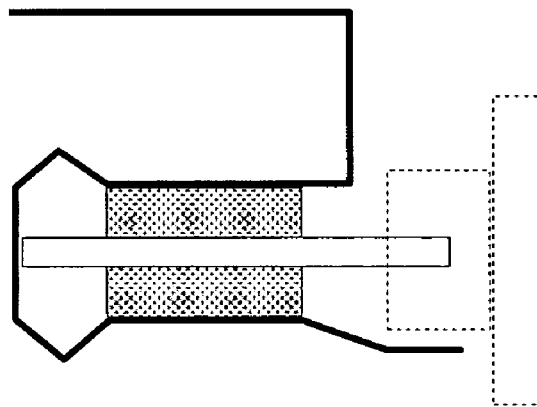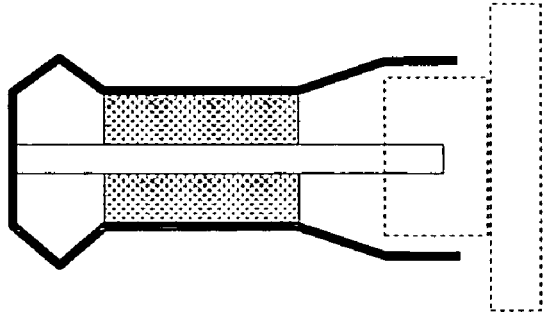
Fig. 4

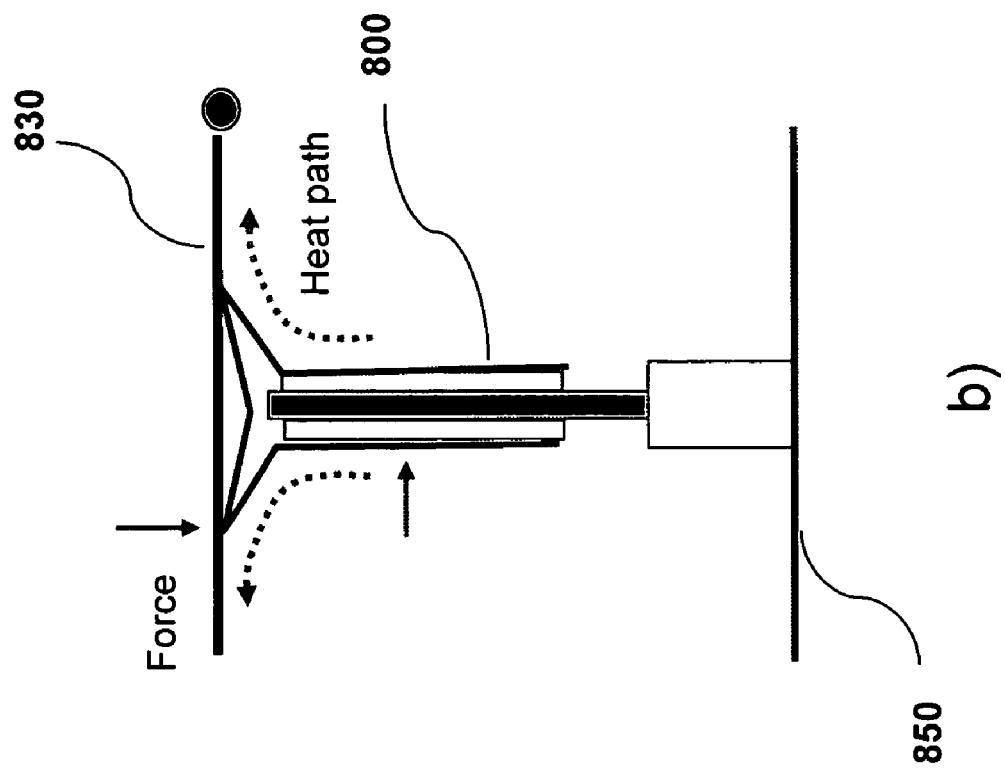
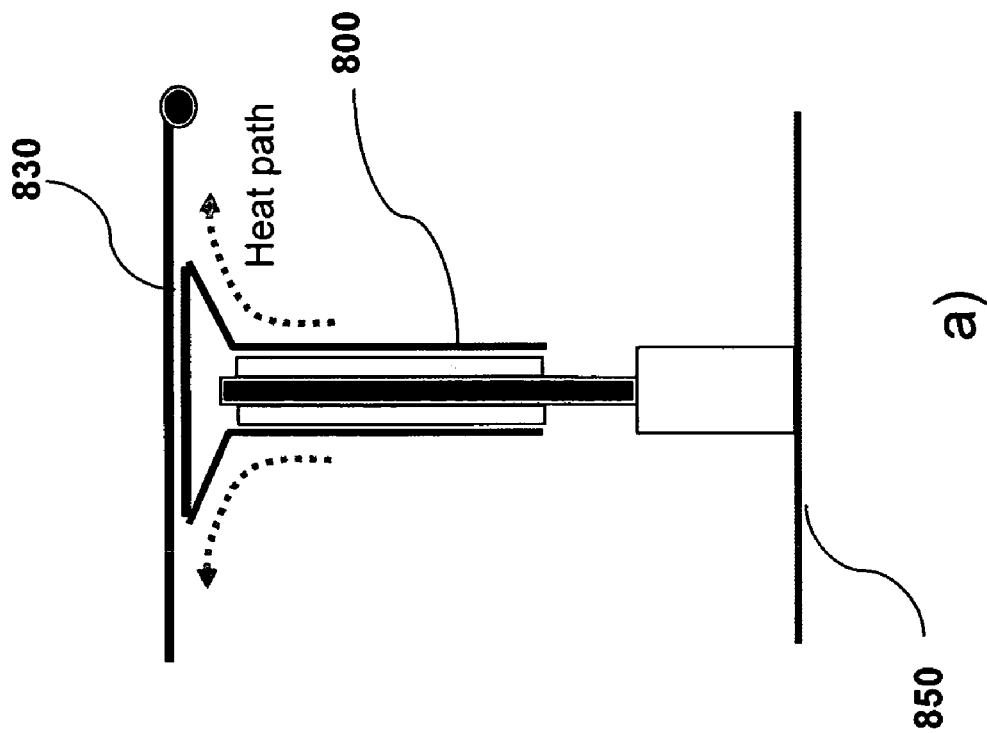
Fig. 8

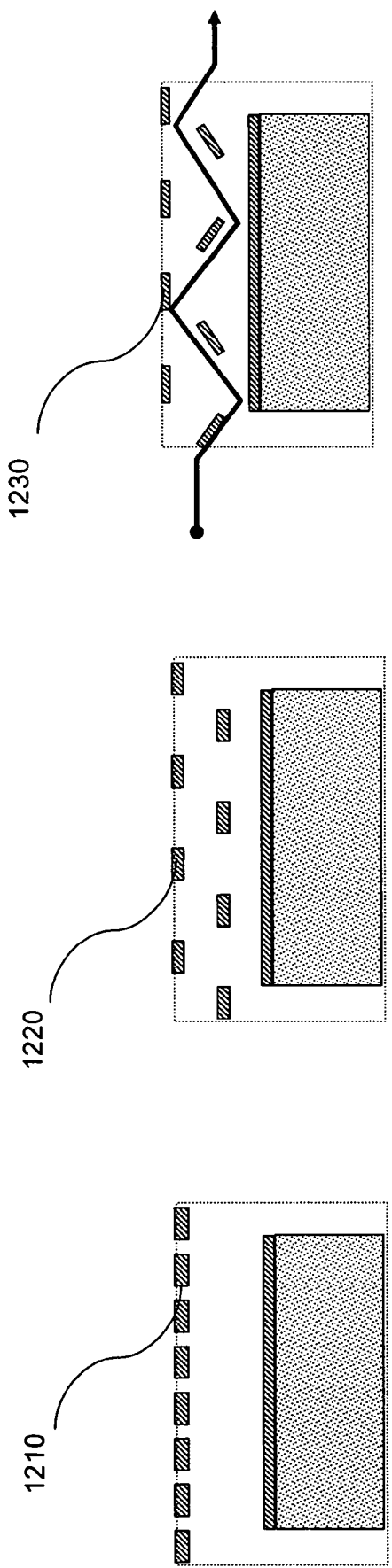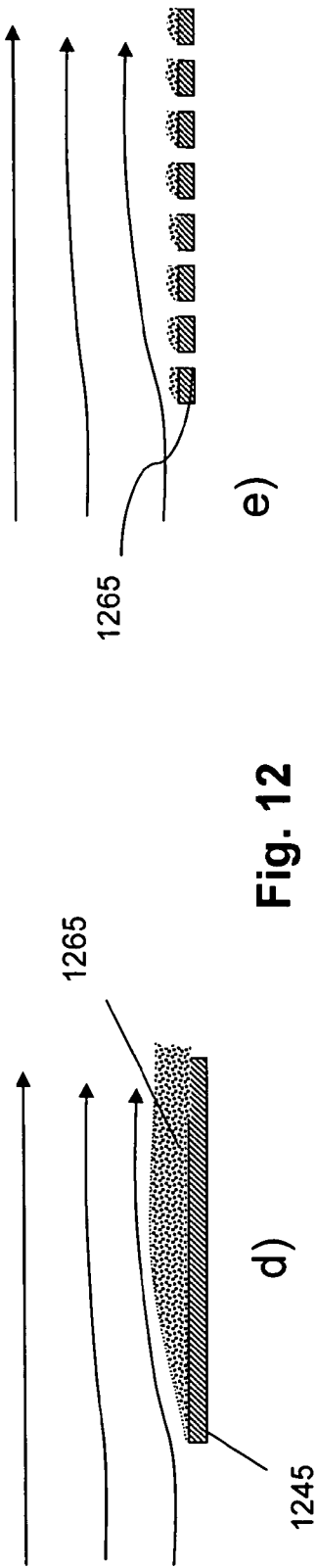
Fig. 12

STRUCTURES TO ENHANCE COOLING OF COMPUTER MEMORY MODULES

CROSS-REFERENCE TO RELATED APPLICATIONS

Not applicable.

STATEMENT REGARDING FEDERALLY SPONSORED-RESEARCH OR DEVELOPMENT

Not applicable.

INCORPORATION BY REFERENCE OF MATERIAL SUBMITTED ON A COMPACT DISC

Not applicable.

FIELD OF THE INVENTION

The invention disclosed broadly relates to the field of heat dissipation, and more particularly relates to the field of heat dissipation in very low profile memory modules.

BACKGROUND OF THE INVENTION

In a standard memory module (also called DIMM-dual inline memory module), the silicon area as well as the convective surface of the substrate is large enough to keep the thermal challenges under control. Thus a conventional DIMM, compared to very low profile-DIMMs (VLP-DIMM)) does not demand stringent air flow or thermally-centric design. Increasing the capacity of VLP-DIMM requires multiple chip stacks, thereby increasing the thickness of a module in the direction detrimental to air-flow. When the cross-sectional area available for air flow is at premium within a blade, a thicker VLP-DIMM module creates undesirable reduction in airflow velocity because the impedance to airflow increases with a reduced cross sectional area. Under this restricted condition, enhancement to cooling of a VLP-DIMM or any other memory module becomes important.

Personal computers, work stations and blade servers are designed to accommodate field replaceable memory modules. Referring to FIG. 1 there is shown a typical memory module. The memory modules, also referred to as DIMMS (dual inline memory modules) typically have an industry standard form factor as shown in FIG. 1A. FIG. 1A shows a DIMM module 100 with the basic components of: a printed circuit board 110, memory chips 120, pins 150, and notches 140. Notches 140 line up with the socket where the DIMM 100 is to be inserted. Also shown are the x, y, and z forces acting on the DIMM 100. FIG. 1B shows a side view of the DIMM 100 of FIG. 1A. FIG. 1C shows a top view of the DIMM 100 and FIG. 1D shows a side view of the DIMM 100 affixed to a computer component. In this DIMM 100, the corresponding electrical connectors and memory communication protocol are also standardized.

The memory capacity offered by the industry tends to increase with time. For computers that require larger memory capacity, multiple memory modules are used. Since multiple modules require as many connectors, they require a proportional amount of board space. Therefore a constraint is self-imposed on the number of connectors by a designer of a computer. This, however, imposes a limit on memory capacity which determines overall system performance. In addition to memory capacity, the height of a memory module that dictates the slimness of a server blade is a competitive differentiator. A memory product, sometimes referred to as VLP-DIMMs (Very Low Profile), caters to the needs of the slim blade server industry.

Slim blade servers are attractive for customers requiring large computing power within a limited rack space. Typically about 14 slim blade servers are packed in a 19" rack compared to 10 blades with standard DIMMs. Since the volume available for electronic components and airflow space are correspondingly reduced in a slim blade server, new design challenges are encountered. The heat dissipation in electronic components more or less remains the same in both servers, but the surface area available for heat transfer is reduced and the resistance to airflow is increased. This trend complicates the management of heat in a slim blade server.

Since the planar area available in the X-Y plane, as shown in FIG. 1A, for a memory module is reduced in a VLP-DIMM, manufacturers opt to stack several layers of memory chips in order to gain higher capacity. FIGS. 2A, 2B, and 2C illustrate the thermal path of a two-stack design. The heat generated in a silicon chip is conducted through the substrate 210 and solder connections 250, and is eventually dissipated into the air 270 through convection, one of the thermal transport mechanisms. In a standard DIMM 100 the silicon area as well as the convective surface of the substrate is large enough to keep the thermal challenges under control. Thus a conventional DIMM 100 does not require increased local air flow or additional heat dissipating structures as do the VLP-DIMMs.

Increasing the capacity of a VLP-DIMM requires multiple chip stacks, thereby increasing the thickness of a module in the Z-direction as illustrated in FIG. 1A. When the cross-sectional area available for air flow is at a premium within a blade, a thicker VLP-DIMM module creates an undesirable reduction in airflow velocity because the impedance to airflow increases with a reduced cross sectional area. Under this restricted condition, enhancement to cooling of a VLP-DIMM or any other memory module becomes important.

Therefore, there is a need for a better cooling structure for VLP-DIMM modules to overcome the shortcomings of the prior art.

SUMMARY OF THE INVENTION

Briefly, according to an embodiment of the present invention, a cooling structure for an in-line chip module comprises a continuous thermal conductive path. The continuous thermal path is a continuous sheet of a thermally conducting material having a front surface and a back surface, the sheet folded at substantially a one-hundred and eighty degree angle, wherein a length of the structure substantially correlates to a length of the in-line chip module, and a width of the structure is wider than a width of the in-line chip module such that the structure fits over and substantially around the in-line chip module. Airflow paths are formed between the structure and the in-line chip module when the structure is affixed to the in-line chip module.

The structure also has openings at the left-side of the structure, the right-side of the structure, and the bottom of the structure for easily affixing and removing the structure from the in-line chip module. Additionally, the structure has a top part comprising a top surface disposed over a top of the in-line chip module when it is affixed to the in-line chip module, and comprising an angled surface flaring outward from the in-line chip module. This angled surface is directly beneath the top surface.

A center horizontal part of the structure is angled inward from the top part such that the center horizontal part is in good thermal contact with a plurality of chips affixed to a printed circuit board of the in-line chip module, the center horizontal part having the length of the in-line chip module and a width of the plurality of the chips. A gap is provided between the center horizontal part and the plurality of chips for placement of a thermal interface material. Lastly, a flared bottom area of the structure extends outward from the in-line chip module and ends in a vertical lip. This bottom area of the structure has no contact with the in-line chip module when affixed to the module.

Additional embodiments of the cooling structure serve to enhance the cooling properties of the structure and include: an asymmetric structure with one side of the structure forming a vertical return leg resulting in a u-shaped channel; a structure wherein the front and back surface convective areas are enhanced with horizontal fins; another structure wherein the front and back surfaces are discontinuous pieces which are conductively coupled together; a structure wherein a continuous conductive path is integrated into an extruded embodiment for conventionally mounted in-line chip modules; and a structure comprising staggered fins. A conductive link element is used to enhance conductivity and also to affix the cooling element.

BRIEF DESCRIPTION OF THE DRAWINGS

To describe the foregoing and other exemplary purposes, aspects, and advantages, we use the following detailed description of an exemplary embodiment of the invention with reference to the drawings, in which:

FIG. 1A is an illustration of an exemplary memory module DIMM showing the x, y, and z forces applied to the module, according to the known art.

FIG. 1B shows front view of the DIMM of FIG. 1A, according to the known art.

FIG. 1C shows a top view of the DIMM of FIG. 1B, according to the known art.

FIG. 1D shows a side view of the DIMM of FIG. 1B, inserted into a socket, according to the known art.

FIG. 2A shows the path of thermal flux through a heatsink, according to the known art.

FIG. 2B is side view of the heatsink of FIG. 2A, according to the known art.

FIG. 2C is another view of the heatsink of FIG. 2A illustrating the convection and conduction paths, according to the known art.

FIG. 4A is the same as FIG. 3B to illustrate the symmetric "skirt-like" construction of the heatsink, according to an embodiment of the present invention.

FIG. 4B shows an asymmetric embodiment of the heatsink of FIG. 4A with a u-shaped channel.

FIG. 4C shows a variation on the asymmetric embodiment of the heatsink of FIG. 4B with a longer u-shaped channel, according to another embodiment of the present invention.

FIG. 8A illustrates a heatsink similar to that of FIG. 3A in contact with a printed circuit board and the lid of a blade server, according to an embodiment of the present invention.

FIG. 8B illustrates the heatsink of FIG. 8A with applied force, according to an embodiment of the present invention.

FIG. 12A shows the fin arrangement of FIG. 11B in which the fins are not maximized for convective efficiency.

FIG. 12B shows a fin arrangement where convection of staggered fins reduces the air temperature to down stream fins.

FIG. 12C shows a set of angled fins which redirects air flow to impinge on surface, improving efficiency.

Figure 3:
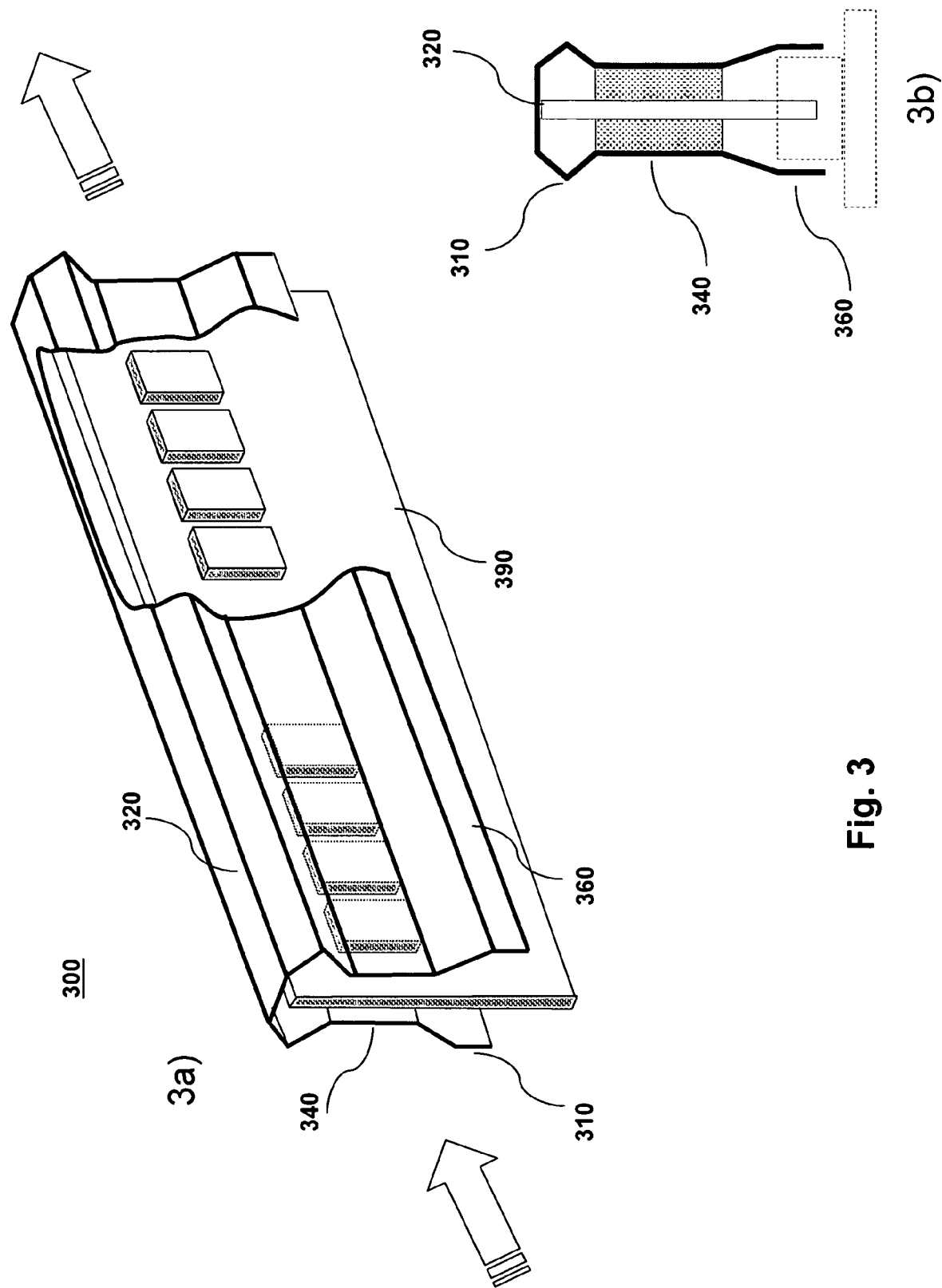
FIG. 3A is an illustration of an exemplary single piece heatsink, according to an embodiment of the present invention.
FIG. 3B is a side view of the single piece heatsink of FIG. 3A, according to another embodiment of the present invention.

While the invention as claimed can be modified into alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the scope of the present invention.

DETAILED DESCRIPTION

We discuss a DIMM design with enhanced heat dissipation, utilizing a continuous conductive path between memory modules. This design is especially applicable to the VLP-DIMMs used with blade servers. Referring now to FIGS. 3A and 3B there are shown illustrations of a heatsink design 300 utilizing a continuous sheet of a thermally conducting material 310, folded as shown, to provide a continuous conductive path. The conducting sheet 310 can either be formed, out of a metal (for example, aluminum) or can be molded of a polymer composite material optimized for thermal and mechanical performance. The conducting sheet 310 must be compliant enough to allow shaping and have sufficient tensile strength to allow for re-shaping after deformation. The deformation may occur if the sheet 310 is pulled apart slightly in order to slip it over the memory module 390. This deformation is actually a spring-like deformation because the sheet 310 "springs" back into its original shape when the applied force is removed.

The center portion 340 of the sheet metal 310 is made to have maximum contact area with the memory modules where an efficient contact is achieved through a thermal interface material (TIM). The air flows in the direction shown. The "skirt" like extension 360 of the sheet 310 downwards provides increased surface area for convective heat transfer. The single piece 300, shown to be symmetrical in FIG. 3B, can be formed as an asymmetrical structure as discussed in detail with respect to FIGS. 4B and 4C below.

In the presence of unbalanced air flow on either side (left or right) of the DIMM 390, the heat can flow from a higher temperature to a lower temperature side of the conducting sheet 310 through the top of the assembly 320. The top portion 320 of the continuous sheet metal 310 provides a conductive path which allows thermal flux to flow to the cooler side. The angles just beneath the top planar surface 320 as shown in FIG. 3A allow for a spring-type assembly such that the cooling structure is affixed to the memory module by simply placing the cooling structure over the memory module and then pressing down until the inside of the top 320 of the cooling structure 300 makes contact with the memory module 390. To make it easier to fit over the memory module 390, the cooling structure 300 may be gently pulled open so as to widen it. Once released, the structure 300 will snap back to its original shape. Once the cooling structure 300 is in place, there is no need to screw it in or otherwise secure it. The cooling structure 300 is easily removed by lifting it up and off the memory module 390.

FIG. 4 illustrates a variation of the single-piece heatsink design 300 of FIG. 3 by showing side views of the heatsinks. FIG. 4A is a side view of the design 300, exactly as shown in FIG. 3B. FIGS. 4B and 4C show different embodiments which increase the convective surface area by adding a return vertical member which forms a U-channel. This U-channel increases the surface area that comes into contact with the fluid (air) flow. The wider channel width results in lowering the fluid resistance.

Figure 5:
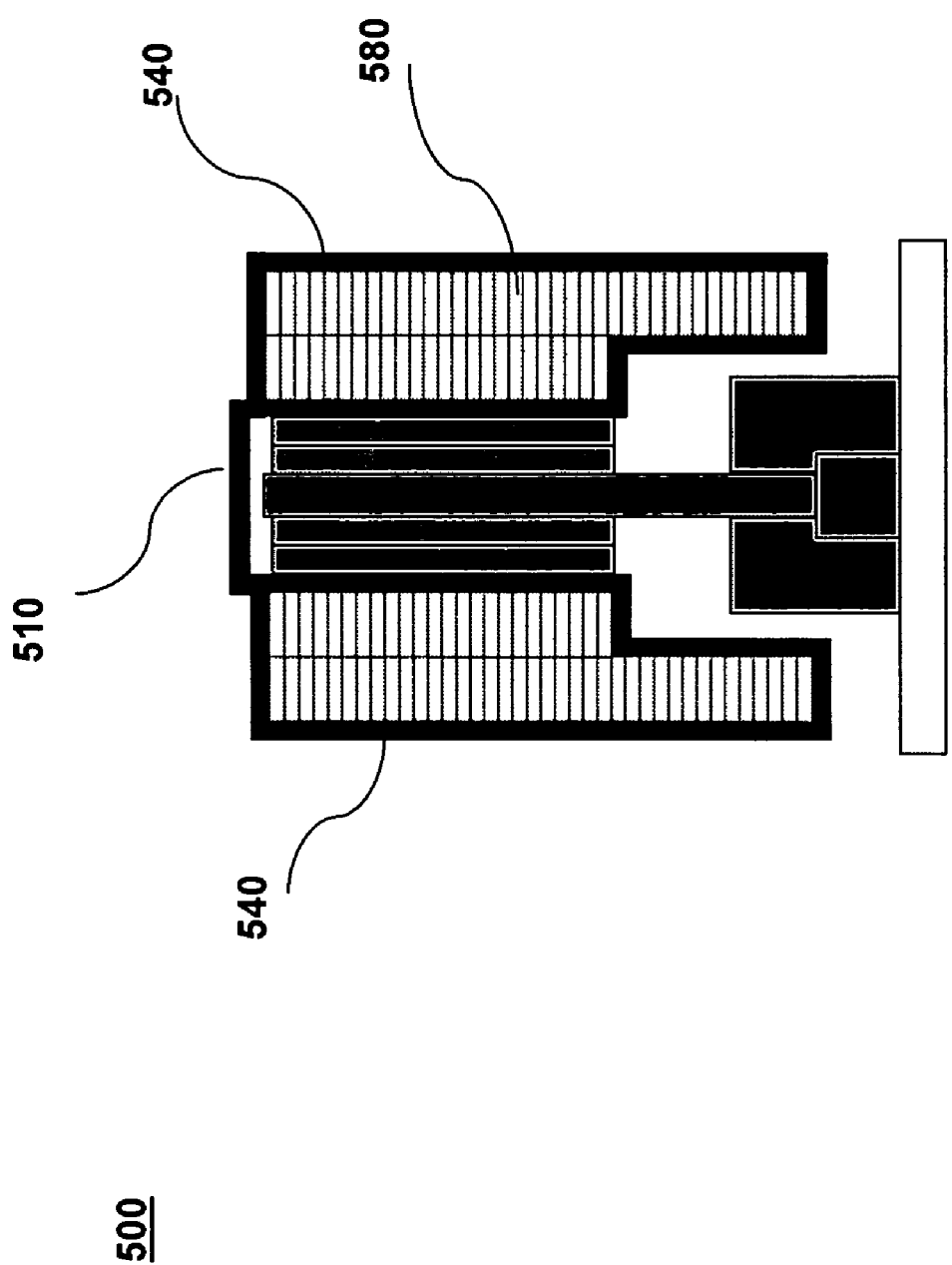
FIG. 5 is an illustration of an exemplary heatsink embodiment with horizontal fins within a sheet frame enclosure.

Referring to FIG. 5 there is shown another heatsink 500 embodiment of the present invention wherein a continuous thermal path is provided within a two-piece design rather than a continuous sheet. In this heatsink 500 multiple horizontal fins 580 are enclosed by mechanically and thermally effective sheet frames 540. Enclosing the fins 580 increases the enclosed area. A link element 510 joins the sheet frames 540 and provides for conductive heat flow due to a temperature differential induced by an unbalanced airflow. The link element 510 acts as a conductive path as well as a joining instrument. The link element 510 can be metal or any other conductive material. It may be soldered on to the assembly or affixed to the assembly using a thermal interface material, or other methods may be used. A conductive link element 510 can be advantageously used in many different embodiments. It is particularly useful in assemblies where certain parts of the modules are lacking adequate airflow. The embodiment shown in FIG. 5 is not a single-piece design as shown in FIG. 3, but rather an assembly utilizing a single conductive path between modules.

Figure 6:
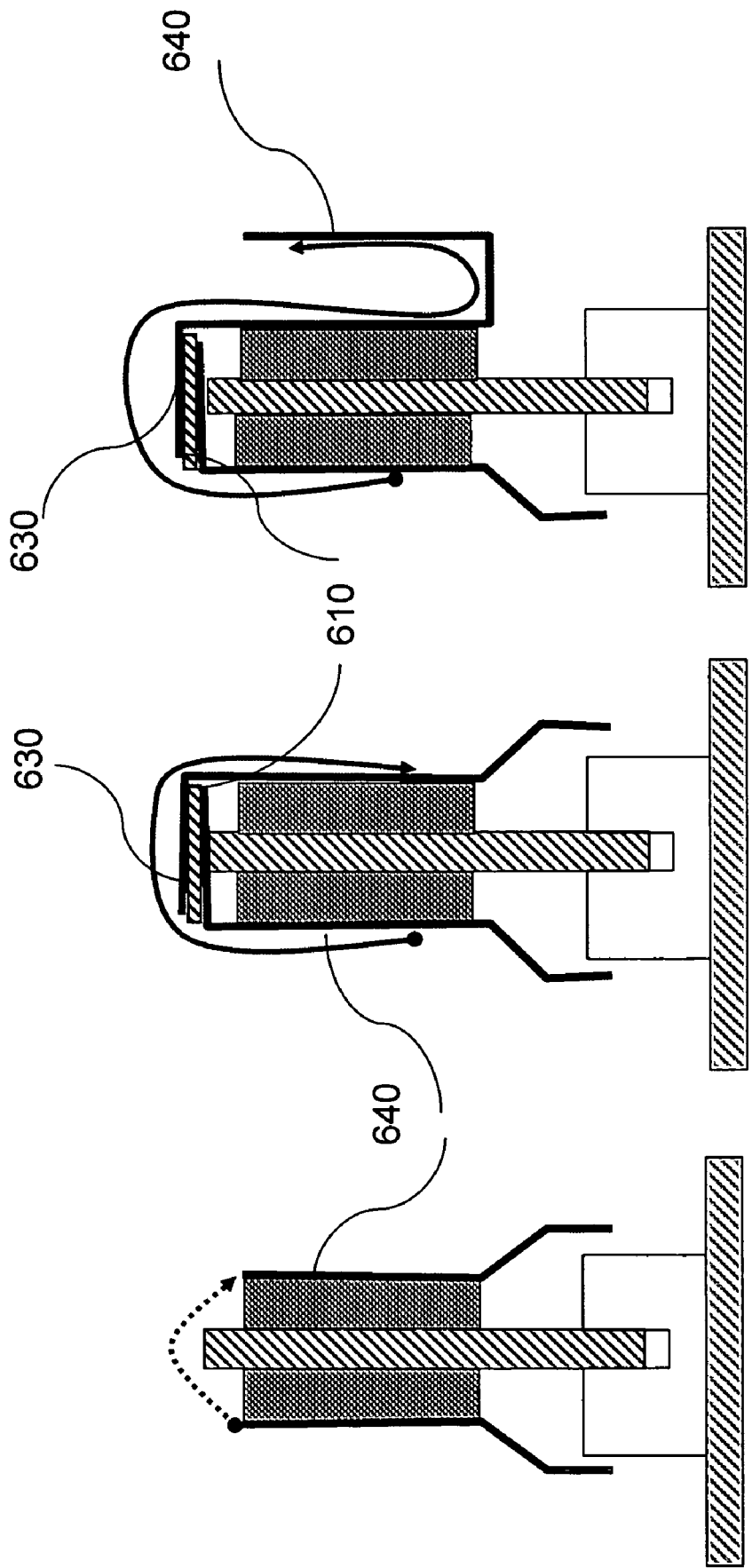
FIG. 6A is an illustration of an exemplary heatsink embodiment with a multi-piece design.
FIG. 6B is a variation on the heatsink of FIG. 6A showing heat flow, according to an embodiment of the present invention.
FIG. 6C is an illustration of an exemplary multi-piece heatsink with a u-shaped channel, showing the placement of thermal insulating material, according to another embodiment of the present invention.

Unbalanced airflow must be taken into consideration. FIGS. 6A and 6B show mechanically separate embodiments of the sheet enclosure corresponding to FIG. 4A to demonstrate the handling of unbalanced airflow. In the presence of an unbalanced airflow, the configuration of FIG. 6A shows a lack of conductive heat flow due to a discontinuity of high conductivity material. This is not optimal because it lacks a continuous heat conduction path. In this example, the left-hand side is a region of low airflow and the right-hand side is a region of higher airflow. A low airflow region equates to higher temperatures. Likewise, a high airflow region equates to lower temperatures. The dotted arrow of FIG. 6A shows the air flowing from a low airflow region to a high airflow region. The configuration of FIG. 6B shows a two-piece design with the sheet enclosure extending over the top of the memory module with a layer of thermal interface material 630 in between. A conductive heat flow is produced due to the temperature differential induced by an unbalanced airflow. This design of FIG. 6B is far better than the design of FIG. 6A for facilitating heat conduction due to unbalanced airflow. This is because the design of FIG. 6B shows a continuity of a high conductivity material. This is achieved through a conductive link element 610 used in conjunction with a thermal interface material 630. The conductive link element 610 in this example is optional. The heat conduction path could be made to be continuous by joining the sheet frames 640.

FIG. 6C is another version of FIG. 6B, with the addition of a U-shaped channel formed into the sheet frame 640, discussed earlier. The channel provides an additional surface area, thereby improving heat dissipation.

Figure 7:
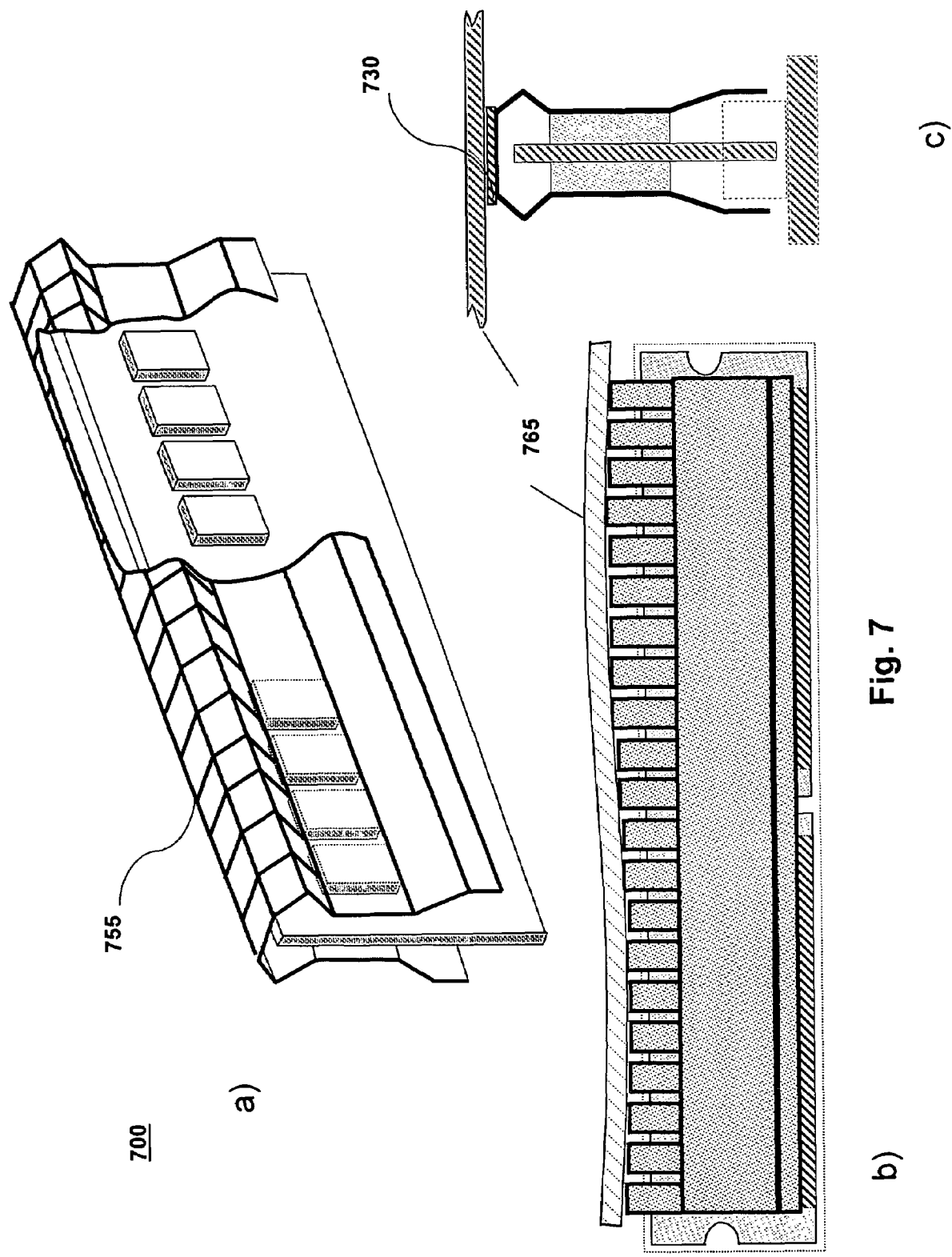
FIG. 7A is a cut-away view of the heatsink of FIG. 3A, with compliant slots formed into the surface, according to another embodiment of the present invention.
FIG. 7B is an exaggerated front view of the heatsink of FIG. 7A, showing the compliant nature of the slots, according to an embodiment of the present invention.
FIG. 7C is a side view of the heatsink of FIG. 7A, according to an embodiment of the present invention.

FIGS. 7A, 7B and 7C show a design wherein the top area of the heatsink 300 of FIG. 3A is made compliant so that it can be intimately connected to the cover or enclosure of a computer, thus providing additional convective surfaces for a DIMM. The compliance is created by cutting slots 755 into the top portion of the structure 700. These slots allow for selective deformation of the structure 700 when pressure is applied to the structure 700. The distribution of the slots 755 throughout the top surface allows for various degrees of deformation depending on where the force is applied and how much force is applied. If force is applied to only one part of the section, only those slots and perhaps their adjacent neighbors will deform, while the rest of the slots remain unchanged. Because of the compliant nature of the sheet and its tensile strength, the slots will be resume their shape once the force is removed. This illustration shows a server cover 765. This particular design shows how the conductive properties of the server cover 765 itself can be used to an advantage by adding a layer of thermal interface material 730 between the heatsink 700 and the server cover 765.

FIG. 8A illustrates another embodiment of the heatsink design attached to a printed circuit board 850 that further facilitates thermal contact between the heatsink 800 and an adjacent surface. In this example the adjacent surface is the lid 830 of a blade server. The heatsink 800 is formed with a fold in the top surface. This fold remains flat until force is applied. Once force is applied in the Y direction, the fold bends in upon itself in order to absorb the force, as shown in FIG. 8B. Once the force is removed, the top surface of the heatsink 800 springs back and resumes a planar form. This heatsink design can further maximize heat dissipation in an electronic enclosure by providing a means of conducting the heat through a compliant surface on the memory DIMM to the enclosure's lid 830, therefore maximizing surface area for convection. If further conduction is necessary a thermal interface material can be used.

Figure 9:
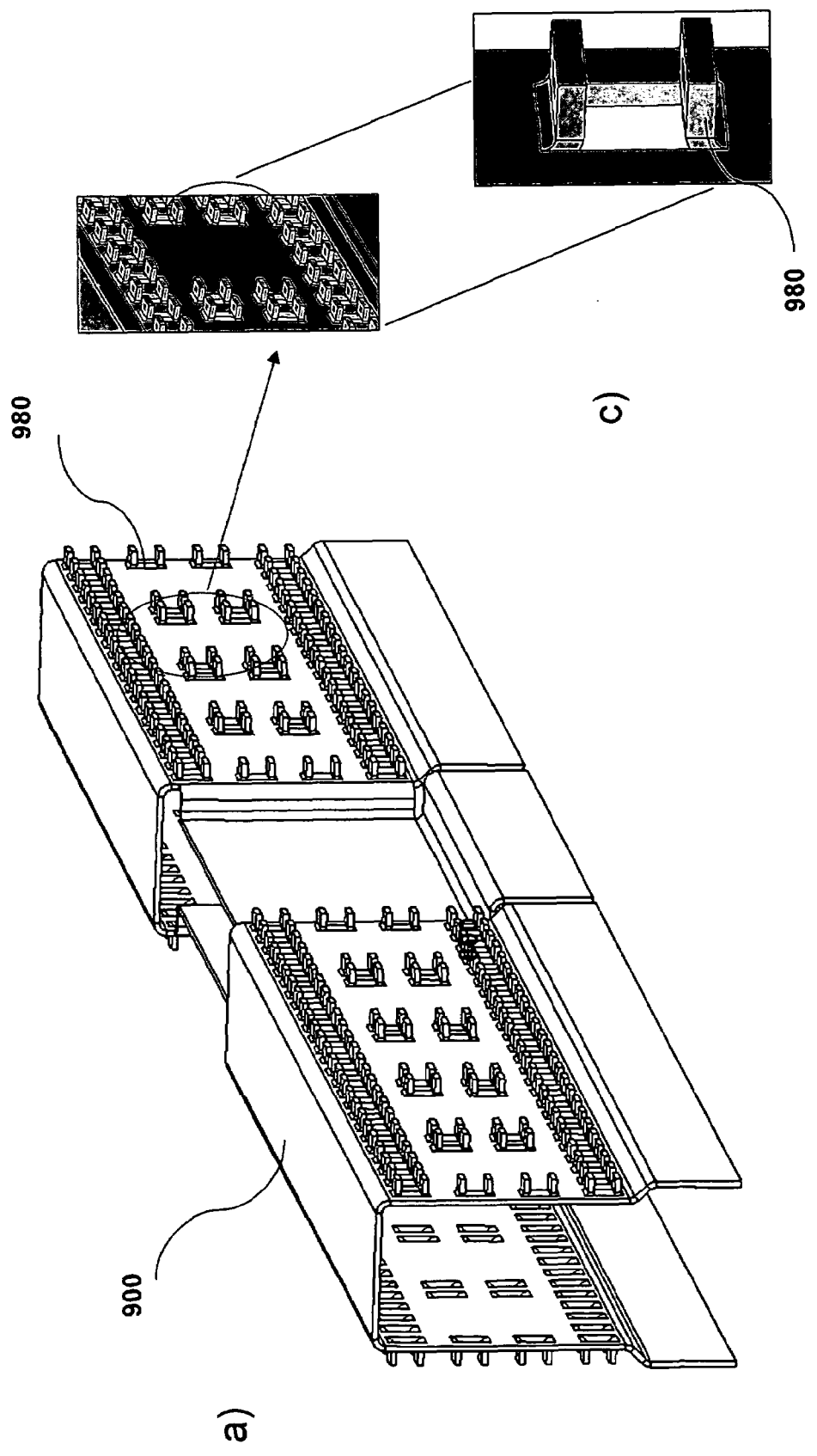
FIG. 9A is a cut-away illustration of a heatsink with an enhanced convection surface with pins, according to another embodiment of the present invention.
FIG. 9B is a partial section view of the heatsink of FIG. 9A showing the air flow movement over and around the heatsink, according to an embodiment of the present invention.
FIG. 9C is an exploded oblique view of the pins, according to an embodiment of the present invention.

FIG. 9A shows a method to generate a larger convective area by inserting miniature fins 980 into the sheet metal heatsink 900. By providing an aerodynamically shaped foil at the leading edge, the resistance to airflow is reduced. FIG. 9C shows an exploded view of the fins 980 where the aerodynamic shape can be seen. This shape can be formed by stamping a sheet metal part to provide the fins, prior to final shape bending. FIG. 9B illustrates the airflow through and around the fins 980.

Figure 10:
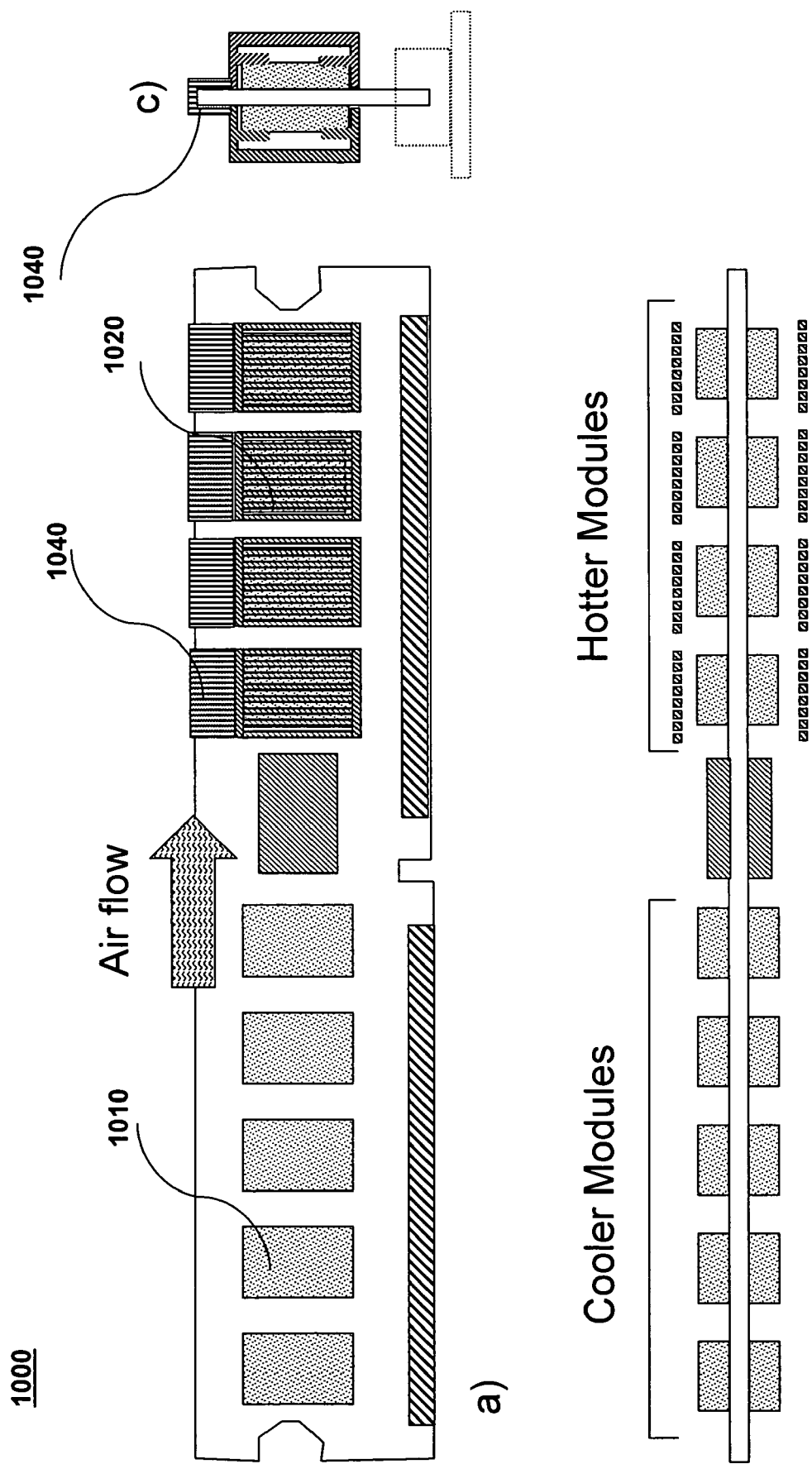
FIG. 10A shows a heatsink design tailored to a specific application configuration, according to an embodiment of the present invention.
FIG. 10B illustrates how the heatsink is affixed over the hotter chips, according to an embodiment of the present invention.
FIG. 10C is a side view of the heatsink of FIG. 10A, according to an embodiment of the present invention.

Referring now to FIG. 10, in applications where the weight of a DIMM is to be kept to a minimum, the heatsink surface is selectively affixed over a select set of memory modules 1020 by a conductive link element 1040 as shown in FIG. 10A. The modules 1020 that are deprived of cooler air in the downstream (shown as the right-hand side in this example) require more convective surface than the modules 1010 in the upstream. FIG. 10C shows the conductive path between discrete heatsinks and also provides an end view where the conductive link element 1040 is clearly shown as a clip affixed over the module. This clip design can be easily affixed over the chips 1020 by simply pulling it open and then releasing it once it is in place, just like the spring-like assembly as discussed with respect to FIG. 3A. FIG. 10B is a top view without showing the link element 1040. This embodiment customizes the heatsink solution to improve heat dissipation only where needed so as to minimize weight and cost.

Figure 11:
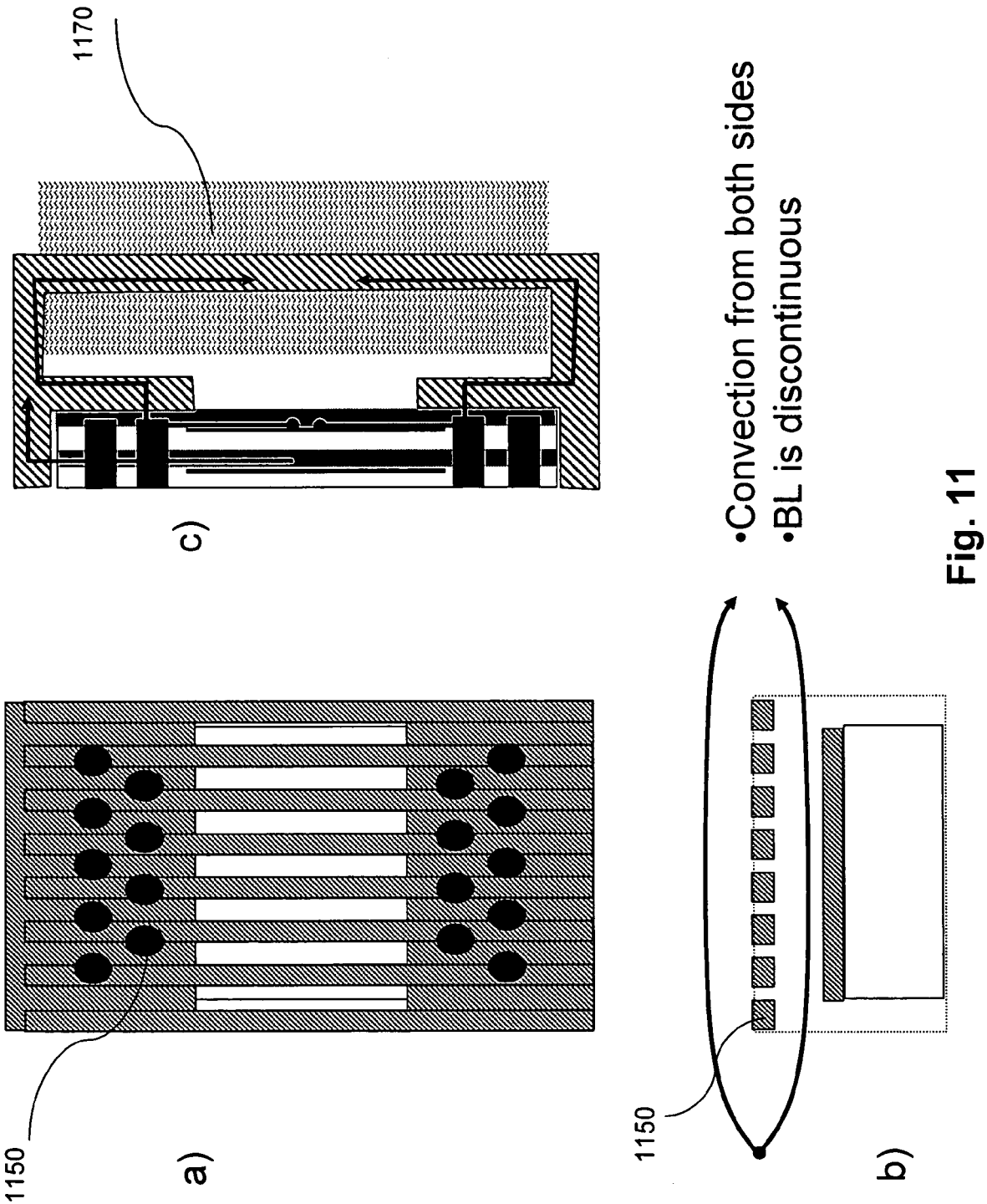
FIG. 11A shows a heatsink wherein the fins are designed to conduct heat from the solder links directly into the mainstream airflow, according to another embodiment of the present invention.
FIG. 11B is a section view of FIG. 11A which illustrates convection from both sides of fins and also a discontinuous fin surface which breaks the boundary layer.
FIG. 11C is a side view of FIG. 11A illustrating the conductive path.

FIGS. 11A, 11B, and 11C illustrate how heat is conducted from the solder links 1150 directly into the mainstream airflow 1170. The solder links are often used to stack memory modules. This example shows two stacked modules, but other configurations are possible. Convection occurs from both sides. Heat spreading in the substrate is not very efficient because substrates are generally not good thermal conductors. This figure is an embodiment of the heatsink solution described with respect to FIG. 10. FIG. 11B shows the airflow from both sides. The boundary layer is not continuous in this example and the effects of this will be discussed more fully below.

FIG. 12 illustrates how fin distribution alters the boundary layer effect. The boundary layer effect is well known in the art. In convective heat transfer the velocity of the fluid region (air) close to the surface reduces to zero and conductive heat transfer occurs over this region. On a long surface this boundary layer increases and therefore creates additional conductive thermal resistance, reducing overall thermal dissipation. FIG. 12D illustrates an uninterrupted main stream airflow. Near the surface 1245 the airflow is interrupted, creating a buildup of a boundary layer 1265 over the surface 1245. one that that maximize convective heat transfer by reducing the boundary layer effect. By breaking the surface 1245 into fins as shown in FIG. 12E, the boundary layer 1265 is segmented, thereby reducing thermal resistance.

Three different fin distributions are shown. FIG. 12A is an example of a fin arrangement 1210 wherein the downstream fins are rendered inefficient because of the thermal resistance buildup. By providing a discontinuous surface the boundary layer is broken and subsequent build-up is kept to a minimum. The fins, when staggered as in the fin arrangement 1220 shown in FIG. 12B, are known to improve thermal efficiency by breaking up the boundary layer, thus increasing thermal dissipation. Impingement of the first surface as shown in the fin arrangement 1230 of FIG. 12C is also beneficial for increasing thermal dissipation.

Figure 13:
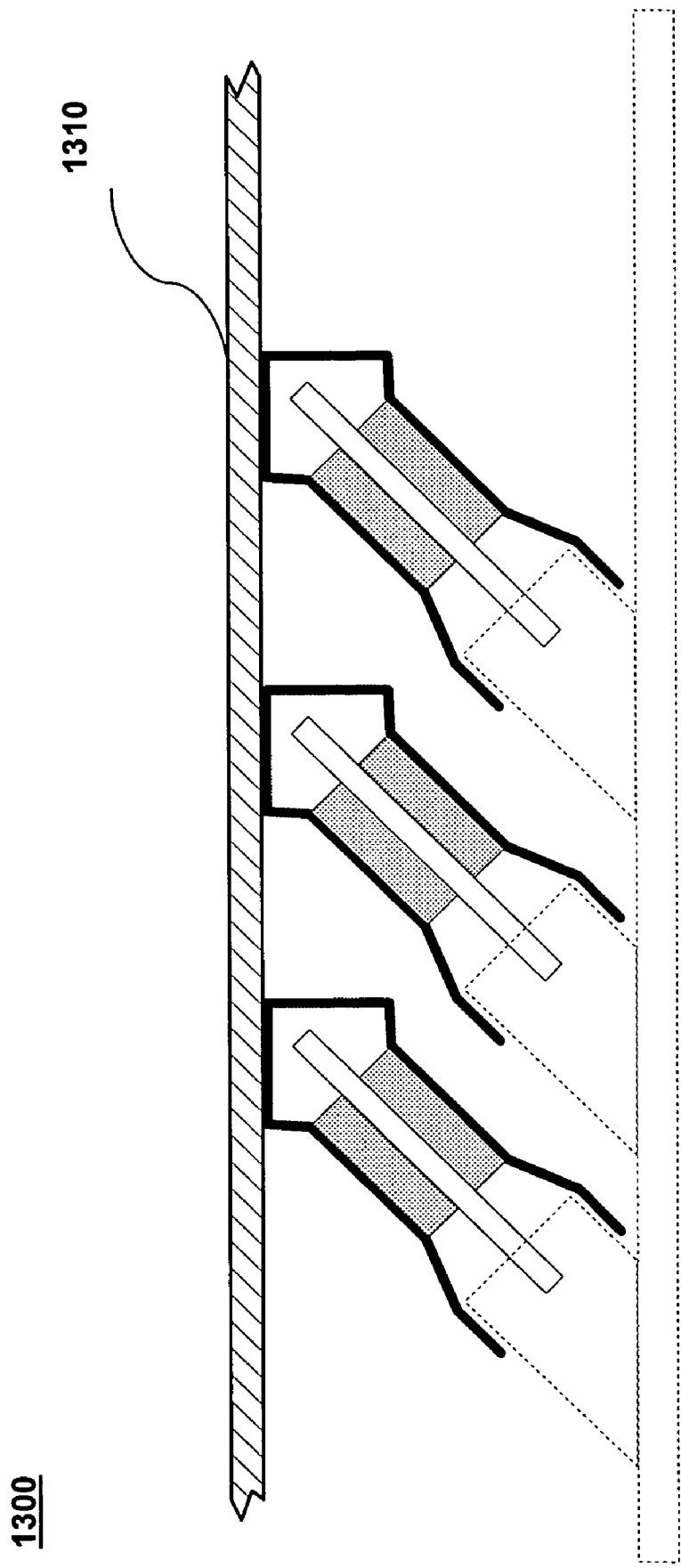
FIG. 13 shows a heatsink for inclined DIMMS, according to an embodiment of the present invention.

FIG. 13 shows a group of DIMMS that are mounted at an angle to the motherboard, but allow extended conduction to the top cover 1310. The heatsinks 1300 of FIG. 13 placed over these DIMMS are similar to the heatsink 300, except that the top portion has been formed into a ninety-degree angle in order to accommodate placement over an inclined DIMM while maintaining a good thermal contact. As can be seen in FIG. 13, one entire side of the top surface of each heatsink remains in complete contact with the surface 1310. This design feature is particularly useful because this inclined placement of DIMMs is often used because of its compactness. Optionally, a thermal interface material could be added between the cover 1310 and the heatsinks 1300.

Figure 14:
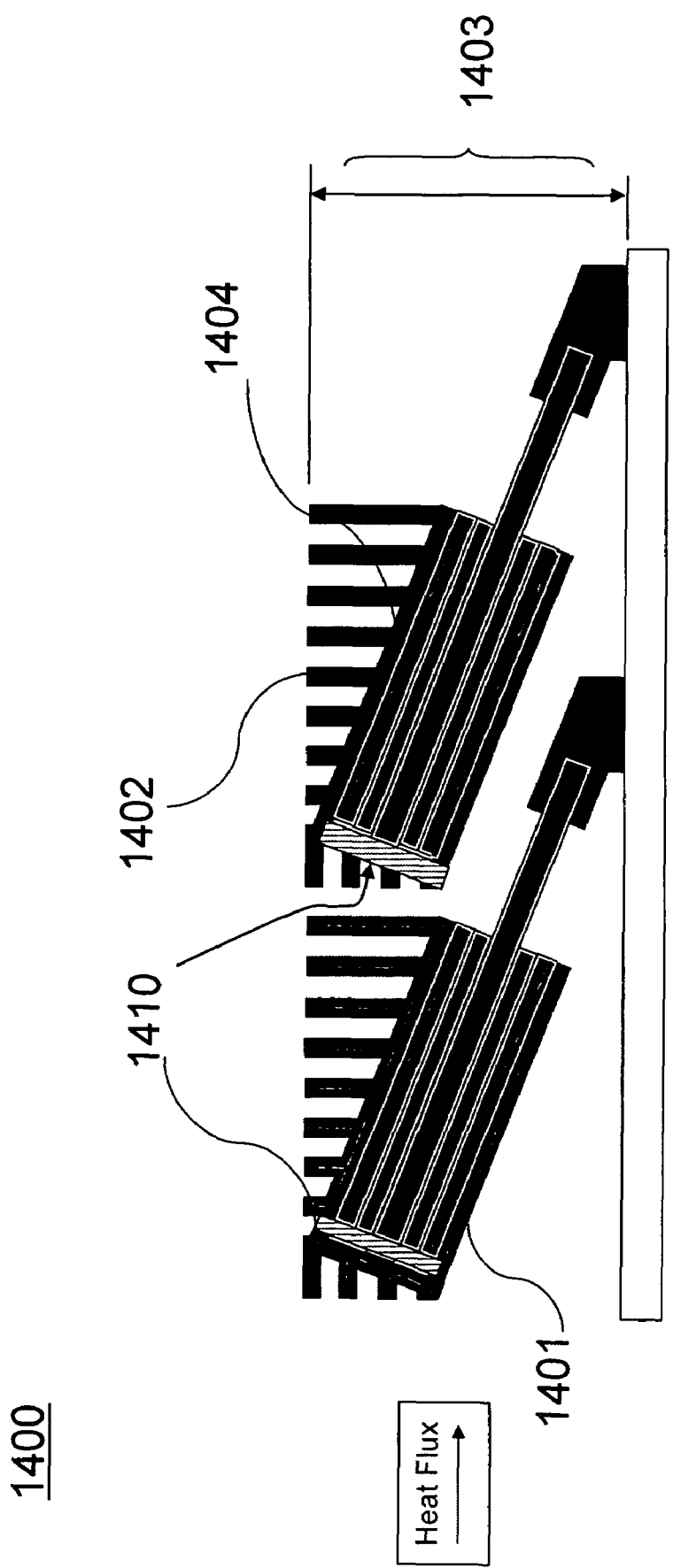
FIG. 14 shows the maximization of fin surface area in an inclined configuration according to an embodiment of the present invention.

FIG. 14 shows a configuration to maximize the fin surface area in an inclined configuration. This configuration 1400 shows that the concept of a continuous conductive path allowing heat to flow to the coldest surface can be applied to conventional memory DIMMs mounted in a conventional (inclined) manner. This embodiment can be made by a traditional method of extrusion. The conductive path 1401 is designated by the arrows around the maximized fin surface area 1402. The compact height packaging 1403 of this inclined DIMM arrangement 1400 is particularly important with the VLP-DIMMs used with blade servers. A conductive thermal interface material 1404 is shown directly beneath the surface area of the heatsink. Also shown is a conductive link element 1410. The fins 1402 are shown as straight structures with a planar surface. This is one example of how fins can be used to bring heat to the top surface, but other fin designs and fin sizes can also be used. Optionally, fins 1402 can be connected to the top cover using a thermal interface material.

Figure 15:
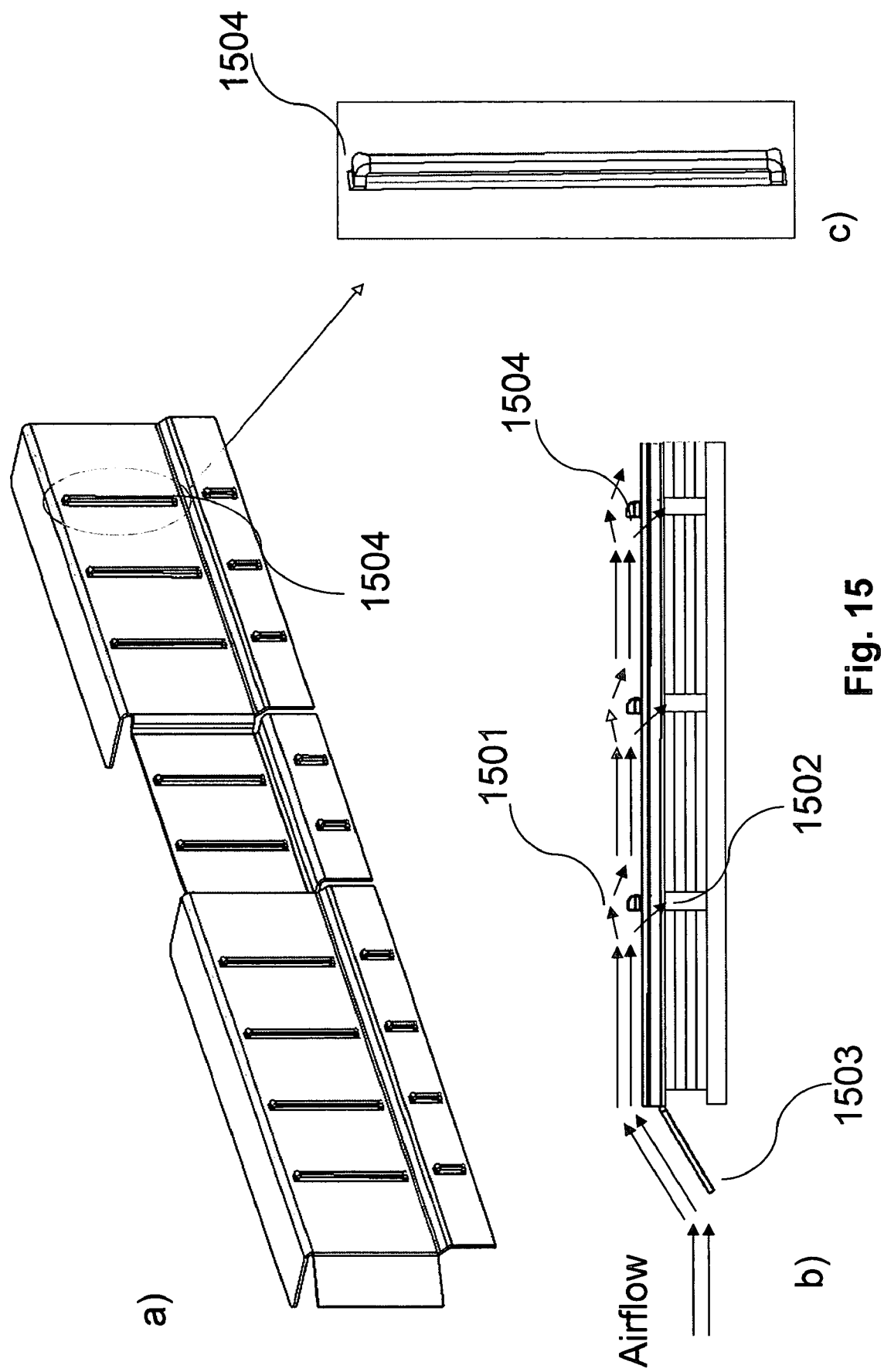
FIG. 15 shows a heatsink design where the air is scooped from the side of the heatsink surface area and then forced to flow over the edge surfaces of the memory modules, according to an embodiment of the present invention.

FIG. 15 is a thermal enhancement showing how channeling the airflow 1501 between adjacent modules 1502 by air that is scooped from the side 1503 of the heatsink surface and then forced to flow over the edge surfaces of the memory modules can enhance convection of the chip surfaces directly. An opening 1504 allows for air to be scooped into the gaps between the chips. The decidedly non-aerodynamic shape of this opening traps airflow and directs it into the structure to further cool the chips.

Therefore, while there have been described what are presently considered to be the preferred embodiments, it will be understood by those skilled in the art that other modifications can be made within the spirit of the invention.

We claim:

1. A cooling structure for an in-line chip module, the cooling structure comprising:
   a thermal conductive path comprising a continuous sheet of a thermally conducting material having a front side and a back side, the sheet folded at substantially a one-hundred and eighty degree angle, wherein a length of the structure substantially correlates to a length of the in-line chip module, and a width of the structure is wider than a width of the in-line chip module such that the structure fits over and substantially around the in-line chip module;
   airflow paths between the structure and the in-line chip module formed when the structure is affixed to the in-line chip module;

openings at a left-side of the structure, a right-side of the structure, and a bottom of the structure for easily affixing and removing the structure from the in-line chip module;

the structure further comprising:

a top part comprising a top surface disposed over a top of the in-line chip module when affixed to the in-line chip module, and further comprising an angled surface extending from the top surface, the angled surface flaring outward from the in-line chip module, the angled surface positioned directly beneath the top surface;

a center horizontal part, the center horizontal part angled inward from the top part such that the center horizontal part is in good thermal contact with a plurality of chips affixed to a printed circuit board of the in-line chip module, the center horizontal part having the length of the in-line chip module and a width of the plurality of chips wherein the center horizontal part has horizontal fins that are formed adjacent to compliant slots in the front and back surfaces;

a gap between the center horizontal part and the plurality of chips, the gap for placement of a thermal interface material; and a flared bottom area of the structure, extending outward from the in-line chip module and ending in a vertical lip, the bottom area of the structure having no contact with the in-line chip module when affixed to the in-line chip module.

2. The cooling structure of claim 1 wherein the thermally conducting material is aluminum.

3. The cooling structure of claim 1 wherein the thermally conducting material is a thermally enhanced molded polymer.

4. The cooling structure of claim 1 wherein the cooling structure is symmetrical such that the front side and the back side are identical.

5. The cooling structure of claim 1 wherein the cooling structure is asymmetric with one of the front side or the back side forming a vertical return leg resulting in a u-shaped channel.

6. The cooling structure of claim 1 wherein the top surface is formed at an angle for accommodating in-line chip modules mounted on an incline.

7. The cooling structure of claim 1 wherein the horizontal fins are placed in a staggered pattern.

8. The cooling structure of claim 1 wherein the compliant slots are formed in the front and back surfaces to allow for cooling to infiltrate into internal surfaces of the in-line chip module.

9. The cooling structure of claim 1 wherein the top surface of the cooling structure is formed with a spring-like fold such that the fold is deformed such that the top surface is transformed into a v-shaped surface when a force is applied in the Y direction; and the fold springs back such that the v-shaped surface is transformed into a planar surface when the force is withdrawn.

10. The cooling structure of claim 1 wherein the continuous sheet acts as a spring, such that:

the continuous sheet is deformed when force is applied; and the continuous sheet resumes its original shape when the force is withdrawn.

11. A cooling structure for an inline chip module, the cooling structure comprising:

a continuous thermal conductive path comprising a first sheet of a thermally conducting material and a second sheet of a thermally conducting material, wherein the first and second sheets are conductively coupled by overlapping a top part of each the first and second sheets, the first and second sheets joined and folded at substantially a one-hundred and eighty degree angle, wherein a length of the sheets substantially correlates to a length of the in-line chip module, and a width of the sheets is wider than a width of the in-line chip module such that the coupled sheets fit over and substantially around the in-line chip module;

airflow paths between the structure and the in-line chip module formed when the structure is affixed to the in-line chip module;

openings at a left-side of the structure, a right-side of the structure, and a bottom of the structure for easily affixing and removing the structure from the in-line chip module;

the structure further comprising:

the top part comprising a top surface disposed over a top of the in-line chip module when affixed to the in-line chip module, and further comprising an angled surface extending from the top surface, the angled surface flaring outward from the in-line chip module when affixed to the in-line chip module, the angled surface positioned directly beneath the top surface;

a center horizontal part, the center horizontal part angled inward from the top part such that the center horizontal part is in good thermal contact with a plurality of chips affixed to a printed circuit board of the in-line chip module, the center horizontal part having the length of the in-line chip module and a width of the plurality of chips; a gap between the center horizontal part and the plurality of chips, the gap for placement of a thermal interface material; and a flared bottom area of the structure, extending outward from the in-line chip module and ending in a vertical lip, the bottom area of the structure having no contact with the in-line chip module when affixed to the in-line chip module.

12. The cooling structure of claim 11 wherein the cooling structure is symmetrical such that the first sheet and the second sheet are identical.

13. The cooling structure of claim 11 wherein the cooling structure is asymmetric with the second sheet longer than the first sheet, the second sheet forming a vertical return leg resulting in a u-shaped channel.

14. The cooling structure of claim 11 wherein horizontal fins are formed into convective areas of the first and second sheets.

15. The cooling structure of claim 11 wherein compliant slots in the first and second sheets allow for cooling to infiltrate to internal surfaces of the in-line chip module.

16. The cooling structure of claim 11 further comprising a conductive link element, the conductive link element formed of a thermally conducting material and having a spring-like property.

17. The cooling structure of claim 11 further comprising slots with non aerodynamic ledges for trapping airflow and directing it into the inline chip module.

18. The cooling structure of claim 11 wherein the cooling structure is selectively affixed to a section of the in-line chip module to decrease overall weight, the section corresponding to a hottest part of the in-line chip module.

* * * * *